United States Patent
Chhodavdia

(10) Patent No.: US 10,742,216 B1
(45) Date of Patent: Aug. 11, 2020

(54) CLOCK DOMAIN CROSSING FOR AN INTERFACE BETWEEN LOGIC CIRCUITS

(71) Applicant: Microsoft Technology Licensing, LLC, Redmond, WA (US)

(72) Inventor: Avdhesh Chhodavdia, Freemont, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/420,888

(22) Filed: May 23, 2019

(51) Int. Cl.
*H03K 19/17736* (2020.01)
*G06F 1/10* (2006.01)

(52) U.S. Cl.
CPC .......... *H03K 19/1774* (2013.01); *G06F 1/10* (2013.01)

(58) Field of Classification Search
CPC .... G06F 1/12; G06F 13/1689; G06F 13/4243; G06F 13/423; G06F 13/4273; G06F 5/06; G06F 11/1679; G06F 9/3871; G06F 17/5059; G06F 15/7825; H03L 7/00; H03L 7/087
See application file for complete search history.

(56) References Cited

U.S. PATENT DOCUMENTS 8,898,502 B2    11/2014  Maddigan et al.
2019/0361486 A1*  11/2019  Malik ............... H03K 19/0033

OTHER PUBLICATIONS

Jan M. Rabaey, "Digital Integrated Circuit: A Design Perspective", 2nd Ed. 2003, Prentice-Hall (Year: 2003).*
"AMBA APB Protocol Version: 2.0 Specification", Retrived From: https://www.eecs.umich.edu/courses/eecs373/readings/IHI0024C_amba_apb_protocol_spec.pdf, Sep. 25, 2003, 28 Pages.

* cited by examiner

Primary Examiner — Seokjin Kim
(74) Attorney, Agent, or Firm — Ranjeev Singh; Singh Law, PLLC

(57) ABSTRACT

Systems, circuits, and methods for clock domain crossing for an interface between logic circuits are provided. A circuit is configured to allow an exchange of signals between a first logic circuit clocked using a first clock signal having a first frequency and a second logic circuit clocked using a second clock signal having a second frequency different from the first frequency. The circuit includes a first circuit segment configured to receive a first control signal to select the second logic circuit and a second control signal to indicate an initiation of an access operation, and ensure that the second control signal maintains a relationship with the first control signal based on the second clock signal. The circuit further includes a second circuit segment configured to receive, from the second logic circuit, a third control signal indicating a readiness of the second logic circuit to complete the access operation.

20 Claims, 7 Drawing Sheets

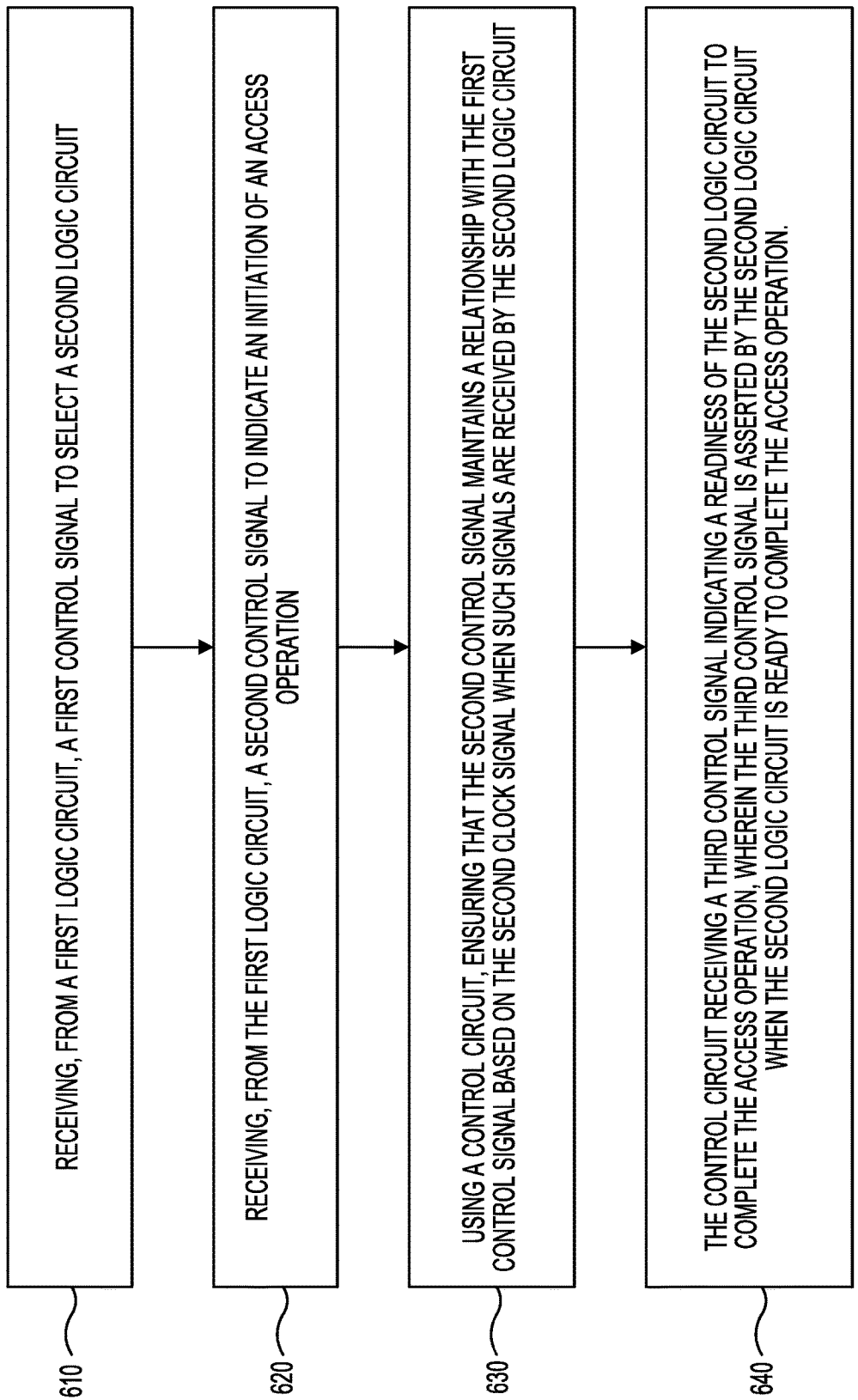

CLOCK DOMAIN CROSSING FOR AN INTERFACE BETWEEN LOGIC CIRCUITS

BACKGROUND

A processing system, such as a system-on-a-chip (SoC), is frequently packaged as an integrated circuit for use in devices, such as smart phones, tablets, digital cameras, virtual reality head-mounted displays, or mixed-reality head-mounted displays. A typical SoC may include at least one processor, a memory (e.g., SRAM), clocking circuitry (e.g., PLLs), peripheral interfaces, other logic circuits, and various busses for interconnecting these logic circuits. Some of the logic circuits may operate at a higher clock frequency than the other logic circuits.

SUMMARY

In one example, the present disclosure relates to a circuit configured to allow an exchange of signals between a first logic circuit and a second logic circuit, where the first logic circuit is clocked using a first clock signal having a first frequency and the second logic circuit is clocked using a second clock signal having a second frequency different from the first frequency. The circuit may include a first circuit segment configured to receive, from the first logic circuit, a first control signal to select the second logic circuit and a second control signal to indicate an initiation of an access operation, where the first circuit segment is further configured to ensure that despite the second frequency being different from the first frequency the second control signal maintains a relationship with the first control signal based on the second clock signal when such signals are received by the second logic circuit. The circuit may further include a second circuit segment configured to receive, from the second logic circuit, a third control signal indicating a readiness of the second logic circuit to complete the access operation, wherein the third control signal is asserted by the second logic circuit when the second logic circuit is ready to complete the access operation.

In another example, the present disclosure relates to a system including a master logic circuit configured to be clocked using a first clock signal having a first frequency. The system may further include a slave logic circuit configured to be clocked using a second clock signal having a second clock frequency different from the first clock frequency. The system may further include a control circuit configured to allow exchange of control signals and data signals between the master logic circuit and the slave logic circuit. The control circuit may include a first circuit segment configured to receive, from the master logic circuit, a first control signal to select the slave logic circuit and a second control signal to indicate an initiation of an access operation, where the first circuit segment is further configured to ensure that, the second control signal maintains a relationship with the first control signal based on the second clock signal when such signals are received by the slave logic circuit. The control circuit may further include a second circuit segment configured to receive, from the slave logic circuit, a third control signal indicating a readiness of the slave logic circuit to complete the access operation, where the third control signal is asserted by the slave logic circuit when the slave logic circuit is ready to complete the access operation initiated by the master logic circuit.

In another example, the present disclosure relates to a method in a system comprising a first logic circuit, a second logic circuit, and a control circuit coupled to both the first logic circuit and the second logic circuit, where the first logic circuit is clocked using a first clock signal having a first frequency and the second logic circuit is clocked using a second clock signal having a second frequency different from the first frequency. The method may include receiving, from the first logic circuit, a first control signal to select the second logic circuit. The method may further include receiving, from the first logic circuit, a second control signal to indicate an initiation of an access operation. The method may further include using the control circuit, ensuring that the second control signal maintains a relationship with the first control signal based on the second clock signal when such signals are received by the second logic circuit. The method may further include the control circuit receiving a third control signal indicating a readiness of the second logic circuit to complete the access operation, wherein the third control signal is asserted by the second logic circuit when the second logic circuit is ready to complete the access operation.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

FIG. 6 shows a flow chart of a method for clock domain crossing in accordance with one example.

DETAILED DESCRIPTION

Examples described in this disclosure relate to systems and methods for clock domain crossing for logic circuits in an integrated circuit. Certain examples relate to the use of a clock domain crossing circuit in a system-on-a-chip (SoC) that may include several logic circuits, some of which may be viewed as master and others as slave in the context of the exchange of control and data signals between them.

Figure 1:
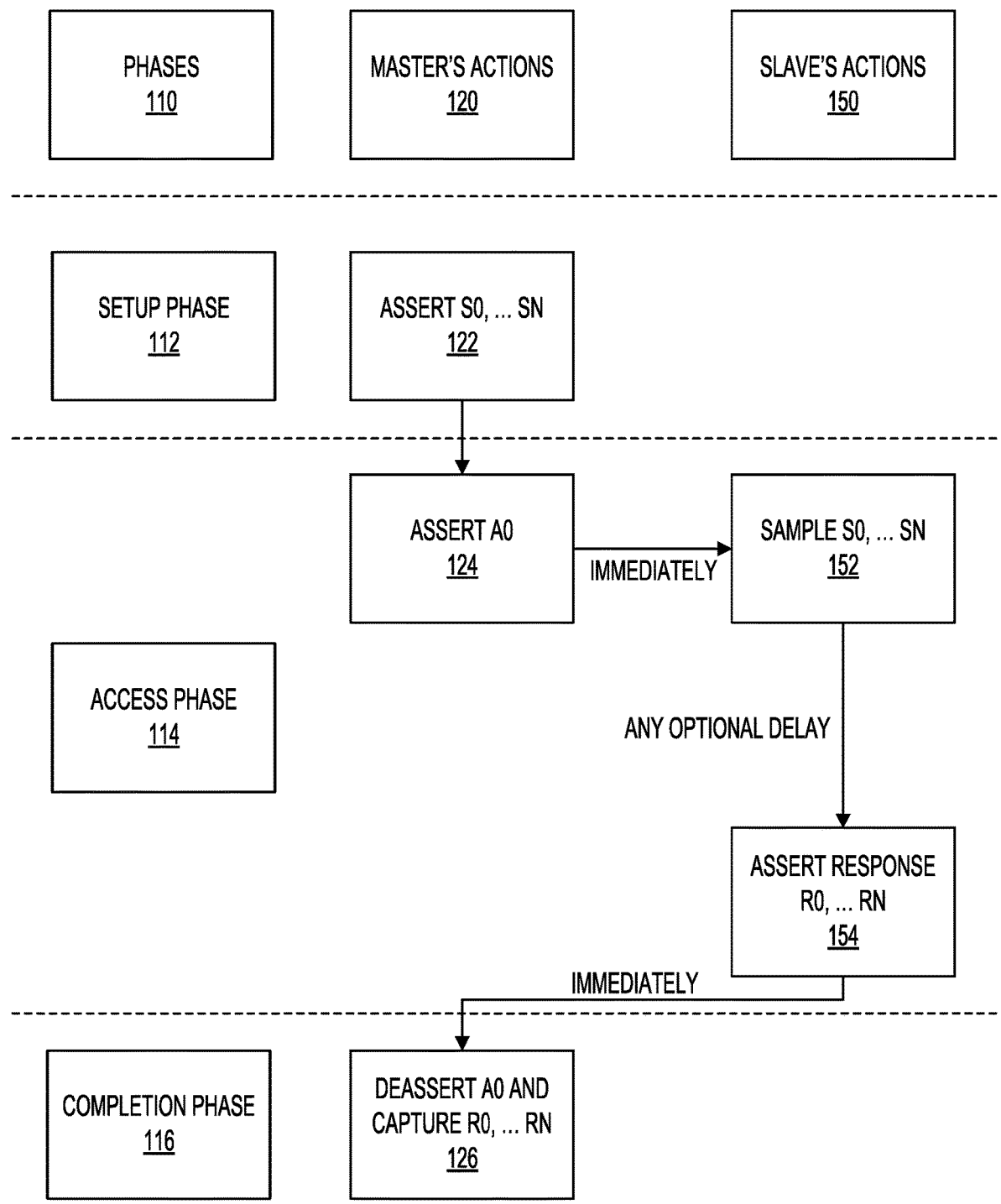
FIG. 1 shows a diagram of an interaction model for clock domain crossing (CDC) in accordance with one example.

FIG. 1 shows a diagram of an interaction model for clock domain crossing (CDC) 100 in accordance with one example. CDC 100 may be modeled as an interaction between a master and a slave. Each of the master and the slave may be one of the functional blocks formed on an integrated circuit. A functional block may be any of a processor core, a controller core, a sensor interface, a peripheral interface, or any other IP block included as part of an integrated circuit, such as a system-on-chip (SoC). In this example, the master may be a logic circuit that is in a first clock domain and the slave may be a logic circuit that is in a second clock domain. In this example, the first clock domain and the second clock domain may have logic that is clocked at different frequencies. As an example, the first clock domain including the master may correspond to a processor that is being clocked at a first frequency and the second clock domain including the slave may correspond to a peripheral that is being clocked at a second frequency lower than the first frequency. CDC 100 shows both the master's actions 120 and the slave's actions 150 in the various phases 110 associated with the clock domain crossing. When both the master and the slave are running using the same clock, the coordination of their actions may be relatively straightforward. However, when the master and slave are operating on clocks with different frequencies, the coordination of their actions is difficult. As an example, across clock domains, one of the problems is maintaining actions that need to happen immediately across the two different clock domains.

With continued reference to FIG. 1, in this example, there may be three phases: setup 112, access 114, and completion 116. In each of these phases 110, the master, the slave, or both perform certain actions related to the signals being exchanged between them. Thus, during setup phase 112, the master may perform an action, such as assert signals (e.g., S0, S1, . . . Sn) 122 to select or more of the slaves that it wants to communicate with. During access phase 114, the master may assert at least one enable signal (e.g., ASSERT AO 124). During access phase 114, the slave may receive the appropriate select signal. In one example of the present disclosure, a circuit arrangement is provided that ensures that when the slave receives the enable signal, the relevant select signals (e.g., any one or more of S0, S1, . . . Sn) are guaranteed to be stable for the slave's use. As an example, this way the slave may sample signals (e.g., S0, S1, . . . Sn) 152 without causing any issues.

Still referring to FIG. 1, during access phase 114, after any optional delay, the slave may assert a response signal (e.g., any one or more of R0, R1, . . . Rn) 154. Once again, the examples of circuit arrangements described herein ensure that when the slave asserts the response, the selected circuit arrangement guarantees that any input(s) to the slave are de-asserted immediately and the response signal(s) from the slave are captured for use by the master (e.g., as part of completion phase 116). Thus, in this example, the master may de-assert AO and optionally invalidate S0, S1, . . . Sn 126. Master may also capture the response signal (e.g., R0, R1, . . . Rn) 126. Although FIG. 1 shows certain phases for which the circuit arrangement guarantees expected behavior even across clock domain crossing, other phases may be included or excluded.

Figure 2:
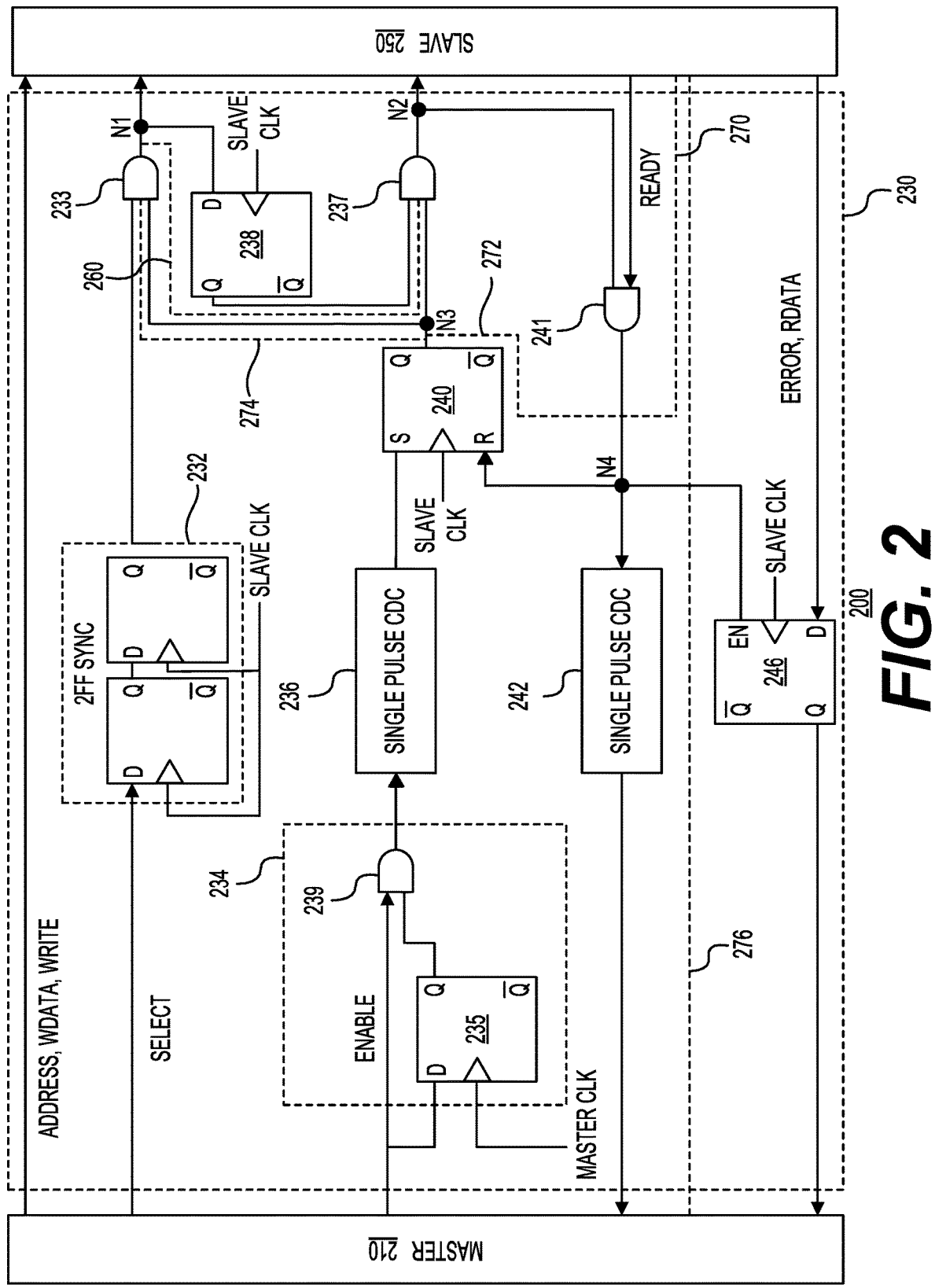
FIG. 2 shows a system including a master, a slave, and a circuit for clock domain crossing in accordance with one example.

FIG. 2 shows a system 200 including a master 210, a slave 250, and a circuit 230 for clock domain crossing in accordance with one example. Circuit 230 may include various circuit portions and components configured to guarantee expected behavior even across clock domain crossings. As an example, master 210 may be operating at a first clock frequency, which is higher than a second clock frequency associated with slave 250. In this example, master 210 may be a processor core connected via an on-chip interconnect (e.g., an interconnect that is an ARM's Advanced Microcontroller Bus Architecture (AMBA) compliant bus) to slave 250. Peripherals may be connected to a peripheral interface (e.g., an ARM's Advanced Peripheral Bus (APB) interface). Circuit 230 may act as a clock domain crossing bridge between master 210 and a slave 250.

With continued reference to FIG. 2, circuit 230 may allow for proper maintenance across the two clock domains between master 210 and slave 250 based on a similar interaction model as described with respect to FIG. 1. Thus, in this case, during the setup phase, master 210 may assert a SELECT signal and assert the ADDRESS, WDATA, and the WRITE signal; during the access phase, the master may assert an ENABLE signal. In one example, the SELECT signal may be used by master 210 to select any one of a number of slaves, including slave 250. In one example, depending on whether the WRITE signal is a logic high or a logic low may determine whether it is a write operation or a read operation. Slave 250 may assert the READY signal when it is ready to either receive the data or provide the data. In one example, as soon as master 210 receives the READY signal, master 210 may de-assert the SELECT signal and the ENABLE signal. As explained later, circuit 230 is configured such that the slave may de-assert the SELECT signal and the ENABLE signal on its side without the master de-asserting these signals. Depending on whether the interaction relates to master 210 performing a write operation or a read operation, slave 250 may assert the appropriate signals as part of the completion phase. Thus, assuming a write operation, slave 250 may assert the ERROR signal if the write operation fails or not assert any signal if the write operation is performed correctly. Assuming a read operation, slave 250 may assert the ERROR signal if the read operation fails or assert the RDATA signal to indicate the presence of data. Although FIG. 2 shows the ADDRESS, the WDATA, and the WRITE signals being transferred from master 210 to slave 250 without them being latched or otherwise stored, in one example, these signals may be latched in a set of flip-flops (not shown) that may be clocked using the clock signal being used to clock the logic corresponding to master 210. The addition of these flip-flops may prevent metastability—a state during which certain circuit components may not be able to settle to one or the other logic value within a certain time period. Thus, the flip-flops or similar circuitry may act as synchronizers.

Still referring to FIG. 2, circuit 230 is configured such that it takes advantage of the inherent requirements of the protocol associated with the signals described with respect to FIG. 2. This may advantageously remove the need for multiple asynchronous FIFOs or other such circuits to hold data or other signals that need to be exchanged across the clock domain crossing. This in turn may save space on an integrated circuit that includes the various functional blocks and the clock domain crossing(s). As an example, circuit 230 is configured such that the data to be written to a slave is not latched when the data is crossing the clock domains from the master side to the slave side. Thus, in this example, the ADDRESS signal, the WDATA signal, and the WRITE signal are not latched and are instead simply passed to slave 250 by master 210 via the appropriate busses. In this example, circuit 230 may include several circuit elements and circuit portions configured to enable the clock domain crossing functionality. Thus, circuit 230 may include a 2FF sync portion 232 that is configured to receive the SELECT signal from master 210. Circuit 230 may further include an AND gate 233 configured to receive the output from 2FF sync portion 232. The output of AND gate 233 may be provided to slave 250.

With continued reference to FIG. 2, circuit 230 may include a level-two-pulse (L2P) circuit portion 234. L2P circuit portion 234 may convert all the received signal levels into pulses and transfer a pulse from the master's clock domain to the slave's clock domain. Thus, in this example, L2P circuit portion 234 could transfer an incoming signal (e.g., an incoming signal from the master) regardless of whether it is a very narrow pulse type of signal or a very broad pulse type of signal and convert it into a very narrow pulse for the consumption by the slave's clock domain. In this example, L2P circuit portion 234 may include a flip-flop 235 and an AND gate 239, which may be configured to receive the ENABLE signal as one input and an output from flip-flop 235 that is inverted prior to coupling to the second input of AND gate 239. Although L2P circuit portion 234 is shown as comprising certain elements arranged in a certain manner, L2P circuit portion 234 may include additional or fewer elements arranged differently. In this example, L2P circuit portion 234 is configured to achieve the functionality expressed in the example waveforms 300 shown in FIG. 3.

Figure 3:
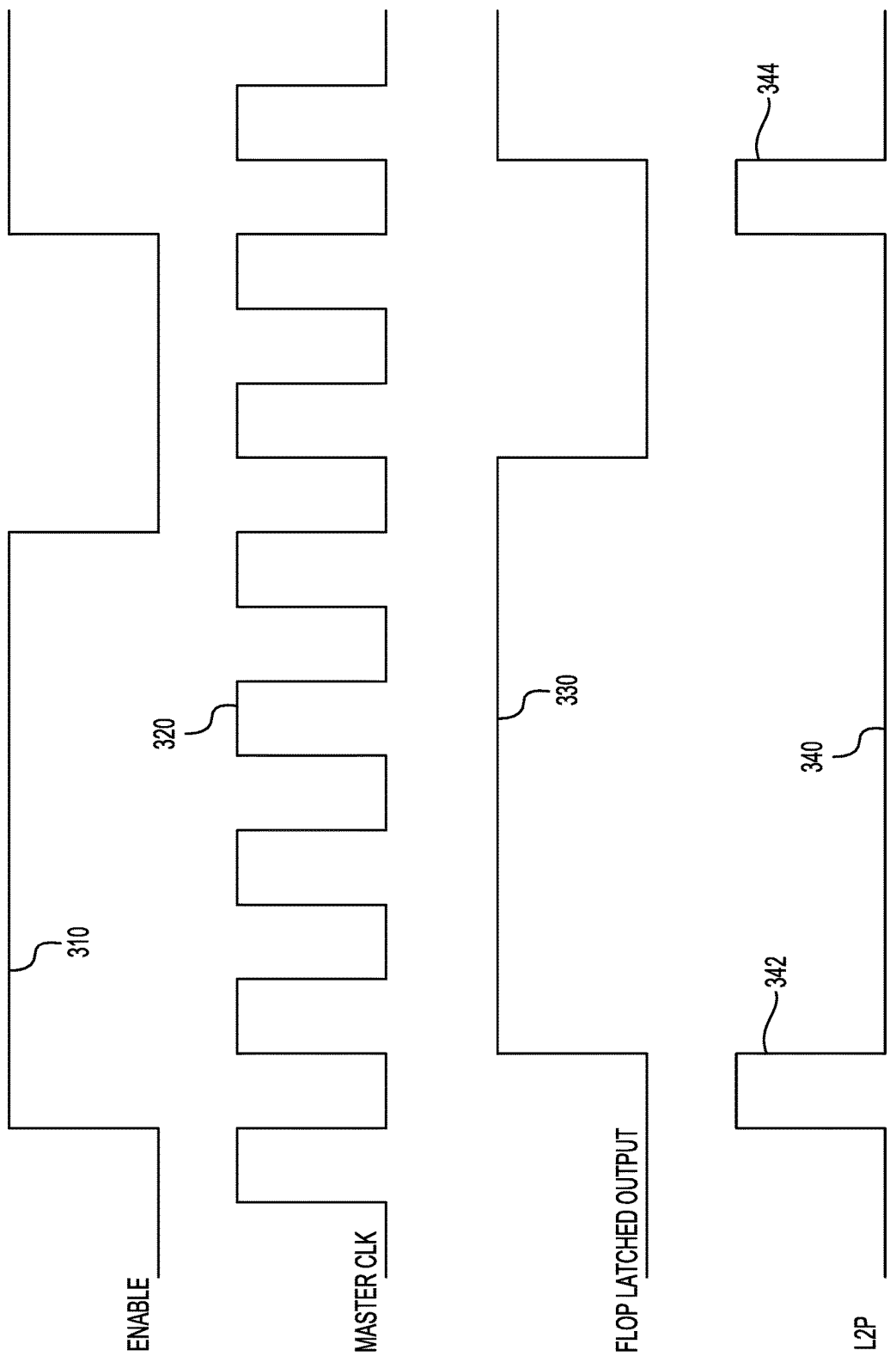
FIG. 3 shows waveforms related to a level-two-pulse (L2P) circuit portion, for use with the circuit of FIG. 2, in accordance with one example.

As shown in FIG. 3, the ENABLE signal represented by waveform 310 may be received as one of the inputs to circuit 230. Waveform 320 shows an example clock signal (e.g., MASTER CLK) corresponding to the master's clock domain. Thus, in this example, the logic and the circuits that are included in master 210 may be clocked using clock signal represented by waveform 320. Waveform 330 shows the output of flip-flop 235. Thus, in this example, flip-flop 235 latches the ENABLE signal and produces an output signal at the next rising edge of the clock signal (represented by waveform 330). The output of AND gate 239 goes to a low state when the flip-flop latches a high value associated with the ENABLE signal. The output of AND gate 239 is also the output of L2P circuit portion 234, which is represented by waveform 340 in FIG. 3. As shown in FIG. 3, waveform 340 comprises a first pulse 342 that corresponds to the first transition of the ENABLE signal from a low state to a high state and a second pulse 344 that represents the second transition of the ENABLE signal from another low state to another high state. Regardless of the duration (or duty cycle) of the ENABLE signal, L2P circuit portion 234 generates a pulse only when the level of the ENABLE signal changes from low to high.

Figure 4A:
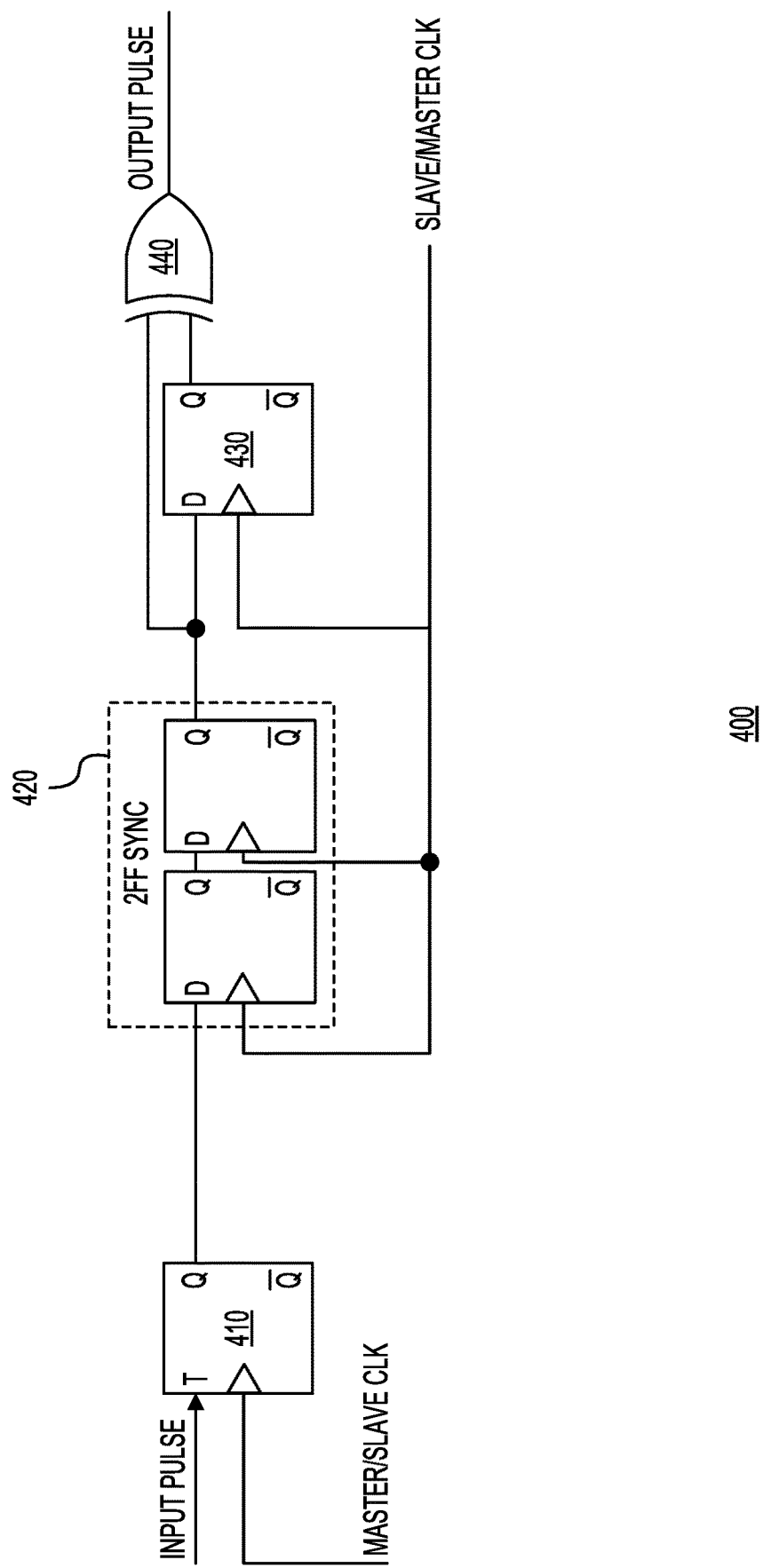
FIG. 4A shows a diagram of a circuit corresponding to a single pulse clock domain crossing (CDC) in accordance with one example.

With continued reference to FIG. 2, the output pulse provided by L2P circuit portion 234 is provided to single pulse clock domain crossing (CDC) 236. In this example, single pulse CDC 236 may take as input the output pulse and convert it into a level signal that is transferred to SR flip-flop 240. FIG. 4A shows a diagram of a circuit 400 corresponding to a single pulse CDC 236 in accordance with one example.

As shown in FIG. 4A, circuit 400 may include a toggle flip-flop 410, a 2FF sync 420, a flip-flop 430, and an exclusive OR gate 440 coupled to each other as shown. Toggle flip-flop 410 may be clocked using the master clock signal (e.g., the MASTER CLK signal shown in FIG. 3) when it is used to condition the ENABLE signal. However, when toggle flip-flop 410 is used as part of single pulse CDC 242 to condition the READY signal, toggle flip-flop 410 may be clocked using the slave clock signal. 2FF SYNC 420, flip-flop 430, and exclusive OR gate 440 may be clocked using the slave clock signal (e.g., the SLAVE CLK signal shown in FIG. 5) when used as part of single pulse CDC 236. However, when 2FF SYNC 420, flip-flop 430, and exclusive OR gate 440 are used to condition the READY signal, then each of these components may be clocked using the master clock signal (e.g., the MASTER CLK signal). The operation of circuit 400 is explained with the help of FIG. 5. Thus, in this example, single pulse CDC 236 is configured as circuit 400 to achieve the functionality expressed in the example waveforms 500 shown in FIG. 5.

Figure 5:
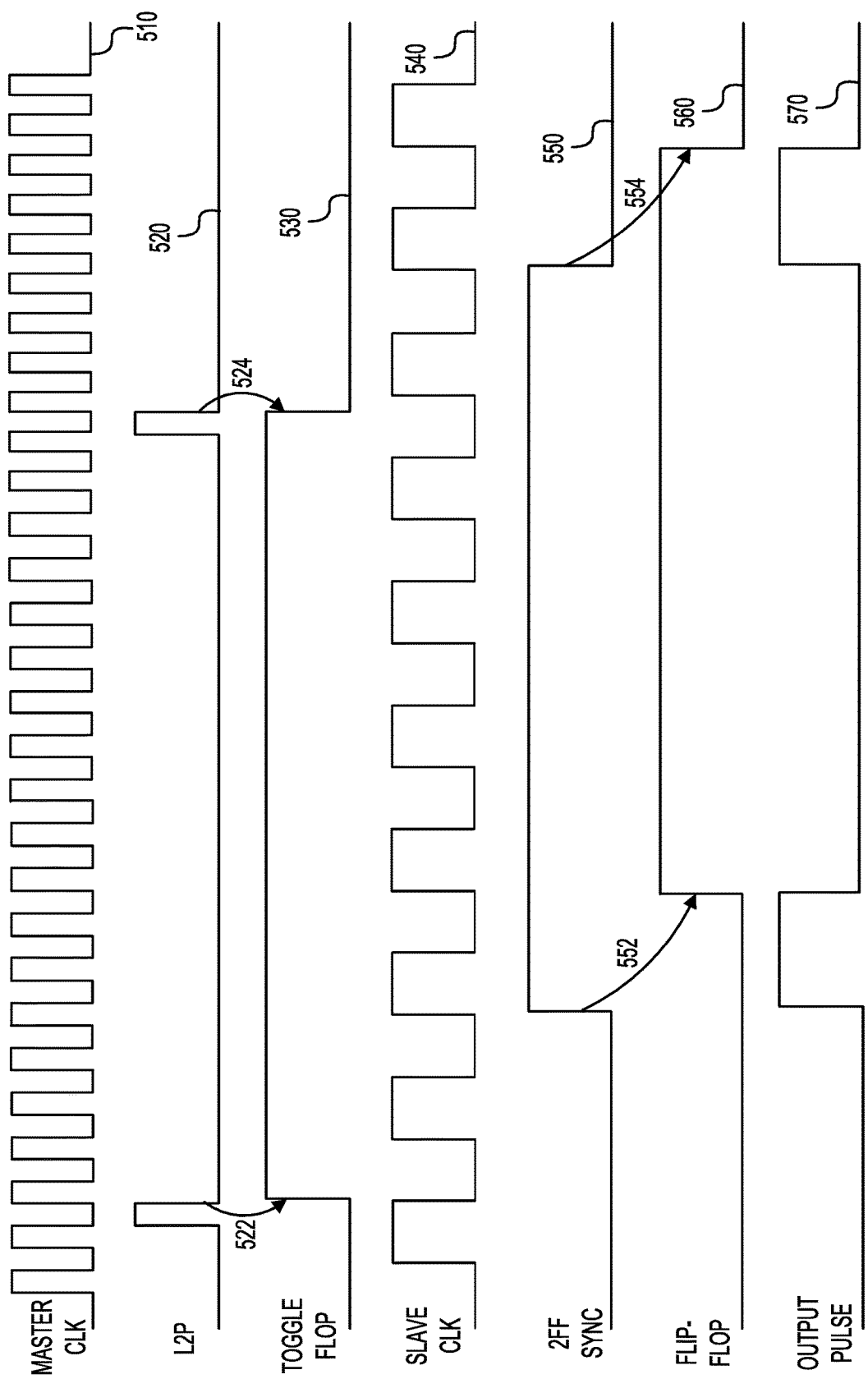
FIG. 5 shows waveforms related to the single pulse CDC of FIG. 4A in accordance with one example.

With reference to FIG. 5, the master clock signal (e.g., MASTER CLK) is shown as waveform 510. The output pulse from L2P circuit portion 234 is shown as waveform 520. In this example, waveform 520 is the same waveform as waveform 340 of FIG. 3, which is received as the input to circuit 400 as the INPUT PULSE at the toggle input (T) of toggle flip-flop 410. Waveform 530 shows the output (Q) of toggle flip-flop 410, which changes from the logic value to the high logic value in response to the arrival of the INPUT PULSE and the clock signal (e.g., the MASTER CLK signal). Toggle flip-flop 410 is configured such that its output changes from one logic value to the other logic value whenever it receives a pulse at its input, and it receives a clock signal. Thus, the output of toggle flip-flop 410 toggles in response to the arrival an input pulse (e.g., the INPUT PULSE). In response to the arrival of another pulse 530 as part of waveform 510, the output of toggle flip-flop 410 changes from the high logic value to the logic value. Waveform 540 corresponds to an example of the slave clock signal (e.g., the SLAVE CLK signal shown in FIG. 3).

As noted earlier, 2FF SYNC 420, flip-flop 430, and exclusive OR gate 440 may be clocked using the slave clock signal when circuit 400 is used to condition the ENABLE signal. As shown in FIG. 4A, 2FF SYNC 420 may include two flip-flops that are coupled in the manner shown in FIG. 4A. Waveform 560 shows an example of the output of 2FF SYNC 420, whose output changes in response to the output of toggle flip-flop 410 in relation to the slave clock signal. Waveform 560 shows the output of flip-flop 430. As shown, a change in the output of 2FF SYNC 420 is latched by flip-flop 430 on the next rising edge of the slave clock signal as shown by the changes (552 and 554) in the output of flip-flop 430. The output of 2FF SYNC 420 and flip-flop 430 are provided as inputs to XOR gate 440. Waveform 570, labeled as the OUTPUT PULSE, shows the output signal of circuit 400. Thus, in this example, circuit 400 converts the pulses (e.g., the INPUT PULSE related pulses) from one clock domain (the master clock domain) to another clock domain (the slave clock domain). Although FIG. 4A shows a certain number of components of circuit 400 arranged in a certain manner, there could be more or fewer number of components arranged differently. As an example, FIG. 4B shows an alternative implementation of a circuit corresponding to single pulse CDC 236.

Figure 4B:
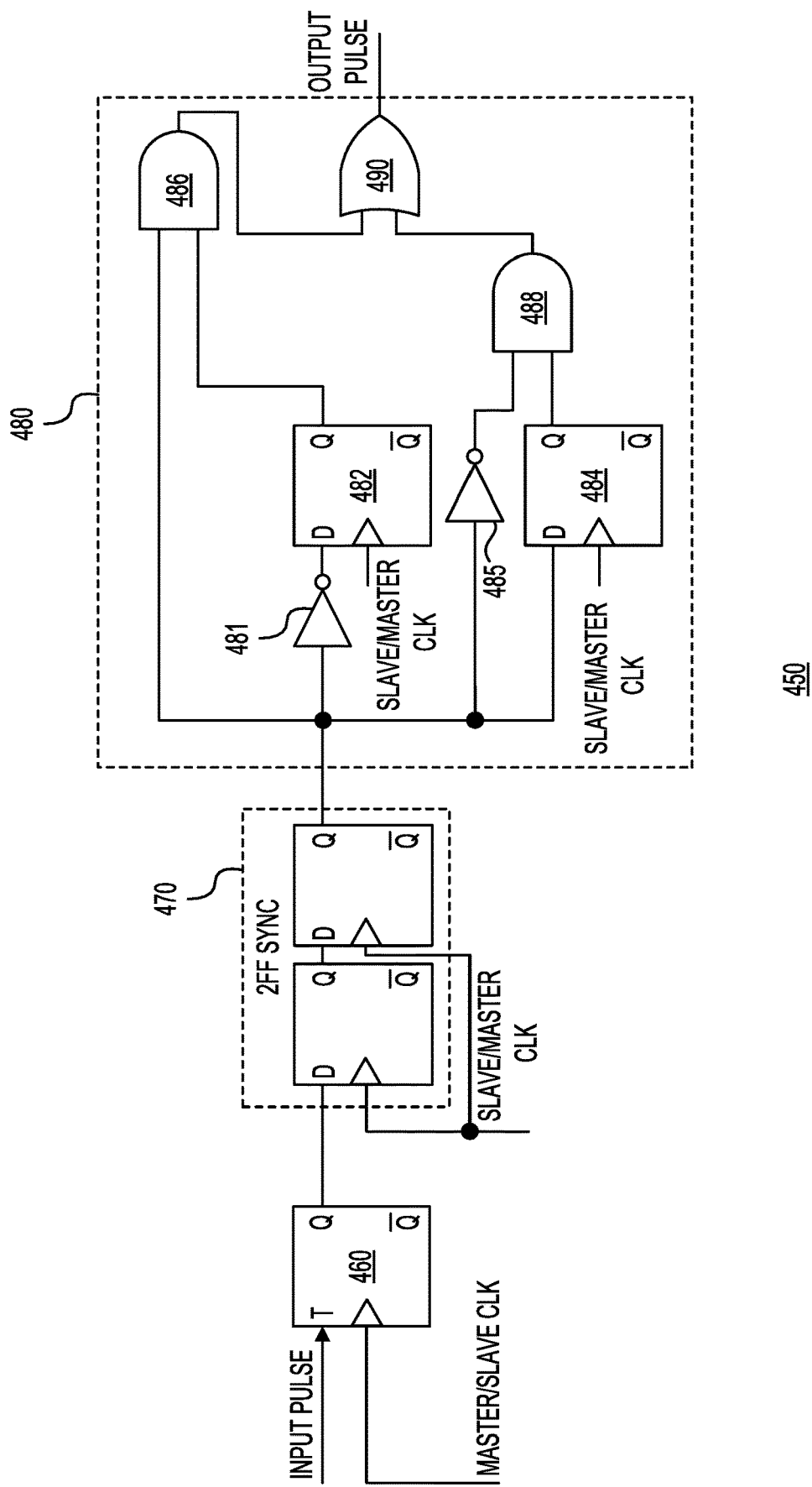
FIG. 4B shows a diagram of another circuit corresponding to a single pulse clock domain crossing (CDC) in accordance with one example.

Referring to FIG. 4B, circuit 450 may include a toggle flip-flop 460, a 2FF sync 470, circuit portion 480 coupled to each other as shown. Circuit portion 480 may include inverters 481 and 485, flip-flops 482 and 484, AND gates 486 and 488, and OR gate 490 coupled to each other as shown in FIG. 4B. Toggle flip-flop 460 may be clocked using the master clock signal (e.g., the MASTER CLK signal shown in FIG. 3) when it is used to condition the ENABLE signal. However, when toggle flip-flop 460 is used as part of single pulse CDC 242 to condition the READY signal, toggle flip-flop 460 may be clocked using the slave clock signal. 2FF SYNC 470, flip-flops 482 and 484 may be clocked using the slave clock signal (e.g., the SLAVE CLK signal shown in FIG. 5) when used as part of single pulse CDC 236. However, when 2FF SYNC 470 and flip-flops 482 and 484 are used to condition the READY signal, then each of these components may be clocked using the master clock signal (e.g., the MASTER CLK signal). In terms of the operation of circuit 450, toggle flip-flop 460 functions in a similar manner as described with respect to FIG. 4A. Also, 2FF SYNC 470 functions in a similar manner as described with respect to FIG. 4A. Circuit portion 480 may be configured such that the OUTPUT PULSE has the same form as waveform 570 of FIG. 5 in relation to the INPUT PULSE and the clock signals. Thus, in circuit portion 480, flip-flop 482 may be configured to capture a logic low value to a logic high value transition in the output of 2FF SYNC 470 and flip-flop 484 may be configured to capture a logic high value to a logic low value transition in the output of 2FF SYNC 470. In this example, the combination of inverter 481, flip-flop 482, AND gate 486, and OR gate 490 may produce the first pulse shown as part of the OUTPUT PULSE (waveform 570 in FIG. 5). The combination of inverter 485, flip-flop 484, AND gate 488 and OR gate 490 may produce the second pulse shown as part of the OUTPUT PULSE (waveform 570 of FIG. 5).

Referring again to FIG. 2, in this example, additional functionality of circuit 230 is described in relation to an example protocol such that circuit 230 takes advantage of the inherent requirements of the protocol associated with the signals described with respect to FIG. 2. The example protocol relates signal transitions to the rising edge of the clock signals, which can correspond to the master clock signal or the slave clock signal. The example protocol imposes certain inherent requirements in terms of the signals that are used to communicate data between a master and slave. As an example, a write operation, initiated by the master (e.g., master 210 of FIG. 2), starts with ADDRESS, WDATA, and the write signal WRITE, being registered at the rising edge of the master clock signal. At the same time, master 210 asserts the SELECT signal allowing it to select the slave device that the write operation is targeting. For the example protocol, these signals are viewed as the signals that are asserted by the master during the setup phase of the protocol (e.g., setup phase 112 of FIG. 1). The example protocol also requires that the ENABLE signal is asserted later (e.g., one clock cycle later). For the example protocol the assertion of this signal occurs during the access phase (e.g., access phase 114 of FIG. 1). Circuit 230 is configured such that regardless of the differences in the clock domains, the ENABLE signal will always trail the SELECT signal by a predetermined number (or portion) of clock cycles associated with the slave clock signal. In this example, circuit segment 260 of circuit 230 is configured as a feedback control segment to ensure that the ENABLE signal will always trail the SELECT signal by a single clock cycle. In this example, circuit segment 260 includes flip-flop 238 and AND gate 237 arranged in the manner shown in FIG. 2.

In terms of the operation of circuit segment 260, single pulse CDC 236 provides a pulse (e.g., the OUTPUT PULSE of FIG. 5) to SR flip-flop 240 in response to the assertion of the ENABLE signal by the master. The output of SR flip-flop 240 is coupled to one input of AND gate 237, which receives its second input from flip-flop 238. In this arrangement, flip-flop 238 has a logic high signal as an output only when the SELECT signal has changed the output value of flip-flop 238. This ensures that AND gate 237 passes the ENABLE signal to the slave only after the SELECT signal has been received by the slave. Thus, in this example, using circuit segment 260, the feeding back of the SELECT signal to the AND gate through which the ENABLE signal must travel ensures that the ENABLE signal always shows up one clock cycle later at the slave. In this manner, circuit 230 uses the requirements associated with the example protocol to ensure clock domain crossing without requiring the use of additional buffers or other similar circuit elements to store the signals from the master to the slave.

With continued reference to FIG. 2, additional circuit segments of circuit 230 may be configured for providing functionality associated with the clock domain crossing. As an example, the example protocol may require that when the READY signal is asserted, the slave can complete the transfer on the next rising edge of the clock signal being used to drive the logic associated with the slave (e.g., SLAVE CLK). Circuit segment 270 may be used to process the READY signal asserted by the slave (e.g., slave 250 of FIG. 2). In this example, circuit segment 270 includes AND gate 241 configured to receive the READY signal as one input and an output of AND gate 237 as the other input and extends up to one input of AND gate 233. Circuit segment 270 includes additional circuit segments, including circuit segment 272 and circuit segment 274. Circuit segment 272 includes SR flip-flop 240. Circuit segment 274 extends from node N3 to the other input of AND gate 233, as shown in FIG. 2. In terms of the operation of circuit segment 270, once the slave is ready to complete the transfer on the next rising edge of the slave clock signal, the slave may assert the READY signal. As long as the output at node N2 is a logic high value, the READY signal may propagate via node N4 to the reset input of SR flip-flop 240 and reset its output value. That in turn will result in the de-assertion of both the SELECT signal and the ENABLE signal. In this example, while the assertion of the READY signal from the slave (e.g., slave 250 of FIG. 2) indicates that the slave is ready to complete the operation (e.g., the write operation), the master (e.g., master 210 of FIG. 2) does not know yet that the slave is ready to complete the transaction or even whether the transaction has already been completed. Regardless, from the perspective of slave 250, these signals have been de-asserted. Thus, in sum, circuit segment 270 is configured to de-assert the ENABLE signal and the SELECT signal when the slave asserts the READY signal, regardless of the difference in the frequency of the clock signals for the master and the slave, respectively.

Still referring to FIG. 2, circuit 230 may further include circuit segment 276. Circuit segment 276 may include AND gate 241 and single pulse CDC 242. Circuit segment 276 may be configured to condition the READY signal for clock domain crossing. In this example, AND gate 241 may receive the READY signal from the slave (e.g., slave 250) as one input. AND gate 241 may receive the output of AND gate 237 as the second input. This may ensure that the READY signal is passed from the slave towards the master side only after the ENABLE signal has been received by the slave. The output of AND gate 241 may be coupled via node N4 to single pulse CDC 242. In this example, single pulse CDC 242 may take as input the READY signal and convert it into a level signal that is transferred to the master. Single pulse CDC 242 may include similar components that are arranged in a similar manner as single pulse CDC 236, which is described earlier with respect to FIG. 3. The clock signals, however, may be reversed to account for the fact that in this instance single pulse CDC 242 is providing clock domain crossing in an opposite direction in relation to single pulse CDC 236. Thus, single pulse CDC 242 may include a toggle flip-flop (like toggle flip-flop 410 of FIG. 4) that receives the READY signal and is clocked using the same clock signal that is being used to clock slave 250. The output of the toggle flip-flop may be coupled to a 2FF SYNC circuit similar to 2FF SYNC 420 of FIG. 4A, which may be clocked using the same clock signal (e.g., the MASTER CLK signal) that is being used to clock master 210. The output of the 2FF SYNC circuit may be coupled to a flip-flop similar to flip-flop 430 of FIG. 4A, which may also be clocked by the MASTER CLK signal. The output of the flip-flop may be coupled to one input of an exclusive OR gate (like exclusive OR gate 440 of FIG. 4A). The other input of the exclusive OR gate may be coupled to receive the output of the 2FF SYNC circuit in a similar fashion as shown in FIG. 4A. In terms of the operation of single pulse CDC 242, it converts the pulses (e.g., the READY signal related pulse) from one clock domain (the slave clock domain) to another clock domain (the master clock domain).

With continued reference to FIG. 2, circuit 230 may further include a set of flip-flops 246 that may be clocked using the SLAVE CLK signal. Each of these flip-flops may be configured to receive the output signal from AND gate 241 via the node N3. In this example, the number of flip-flops 246 depends upon the size of the data bus. As an example, if the data bus carrying the data from slave 250 to master 210 is 32-bits wide, then there may be 32 flip-flops where each of the 32 flip-flops can process one of the bits. In addition, to the extent an error occurs as part of the operation initiated by master 210, circuit 230 may further include flip-flops or other storage circuits to receive the error signal and communicate it to master 210.

FIG. 6 shows a flow chart 600 of a method for clock domain crossing in accordance with one example. In this example, this method may be performed in a system like the one shown in FIG. 2. Thus, in this example, this method may be performed in system 200 including master 210 and slave 250. Master 210 may be characterized as a first logic circuit and slave 250 may be characterized as a second logic circuit. Step 610 may include receiving, from the first logic circuit, a first control signal to select the second logic circuit. In this example, this step may include circuit 230 receiving the SELECT signal from master 210, as explained earlier with respect to FIG. 2.

Step 620 may include receiving, from the first logic circuit, a second control signal to indicate an initiation of an access operation. In this example, this step may include circuit 230 receiving the ENABLE signal from master 210, as explained earlier with respect to FIG. 2.

Step 630 may include using the control circuit, ensuring that the second control signal maintains a relationship with the first control signal based on the second clock signal when such signals are received by the second logic circuit. In this example, this step may include circuit segment 260, as described earlier with respect to FIG. 2, and may ensure that the ENABLE signal trails the SELECT signal by at least one clock cycle of the clock signal (e.g., the SLAVE CLK signal) used to clock slave 250.

Step 640 may include the control circuit receiving a third control signal indicating a readiness of the second logic circuit to complete the access operation, wherein the third control signal is asserted by the second logic circuit when the second logic circuit is ready to complete the access operation. In this example, this step may include circuit segment 270 receiving and processing the READY signal asserted by slave 250 of FIG. 2. Although FIG. 6 describes the steps in a certain order, they need not be performed in this order.

In conclusion, the present disclosure relates to a circuit configured to allow an exchange of signals between a first logic circuit and a second logic circuit, where the first logic circuit is clocked using a first clock signal having a first frequency and the second logic circuit is clocked using a second clock signal having a second frequency different from the first frequency. The circuit may include a first circuit segment configured to receive, from the first logic circuit, a first control signal to select the second logic circuit and a second control signal to indicate an initiation of an access operation, where the first circuit segment is further configured to ensure that despite the second frequency being different from the first frequency the second control signal maintains a relationship with the first control signal based on the second clock signal when such signals are received by the second logic circuit. The circuit may further include a second circuit segment configured to receive, from the second logic circuit, a third control signal indicating a readiness of the second logic circuit to complete the access operation, wherein the third control signal is asserted by the second logic circuit when the second logic circuit is ready to complete the access operation.

The first logic circuit may be configured to de-assert the first control signal and the second control signal upon receiving the third control signal. The circuit may be configured to use inherent properties of a protocol associated with the exchange of signals between the first logic circuit and the second logic circuit. The first control signal may comprise a select signal, the second control signal may comprise an enable signal, and the third control signal may comprise a ready signal.

The circuit may further include a fourth circuit segment configured to: receive data signals in response to the access operation or receive an error signal in response to the access operation. The access operation may comprise a write operation and the relationship may comprise the second control signal trailing the first control signal by any required number of clock cycles of the second control signal.

In another example, the present disclosure relates to a system including a master logic circuit configured to be clocked using a first clock signal having a first frequency. The system may further include a slave logic circuit configured to be clocked using a second clock signal having a second clock frequency different from the first clock frequency. The system may further include a control circuit configured to allow exchange of control signals and data signals between the master logic circuit and the slave logic circuit. The control circuit may include a first circuit segment configured to receive, from the master logic circuit, a first control signal to select the slave logic circuit and a second control signal to indicate an initiation of an access operation, where the first circuit segment is further configured to ensure that, the second control signal maintains a relationship with the first control signal based on the second clock signal when such signals are received by the slave logic circuit. The control circuit may further include a second circuit segment configured to receive, from the slave logic circuit, a third control signal indicating a readiness of the slave logic circuit to complete the access operation, where the third control signal is asserted by the slave logic circuit when the slave logic circuit is ready to complete the access operation initiated by the master logic circuit.

The second circuit segment may further be configured to de-assert the first control signal and the second control signal from a perspective of the slave logic circuit. The master logic circuit may be configured to de-assert the first control signal and the second control signal upon receiving the third control signal. The control circuit may be configured to use inherent properties of a protocol associated with the exchange of signals between the master logic circuit and the slave logic circuit. The first control signal may comprise a select signal, the second control signal may comprise an enable signal, and the third control signal may comprise a ready signal.

The system may further include a fourth circuit segment configured to: receive data signals in response to the access operation or receive an error signal in response to the access operation. The access operation may comprise a write operation and the relationship may comprise the second control signal trailing the first control signal by any required number of clock cycles of the second control signal.

In another example, the present disclosure relates to a method in a system comprising a first logic circuit, a second logic circuit, and a control circuit coupled to both the first logic circuit and the second logic circuit, where the first logic circuit is clocked using a first clock signal having a first frequency and the second logic circuit is clocked using a second clock signal having a second frequency different from the first frequency. The method may include receiving, from the first logic circuit, a first control signal to select the second logic circuit. The method may further include receiving, from the first logic circuit, a second control signal to indicate an initiation of an access operation. The method may further include using the control circuit, ensuring that the second control signal maintains a relationship with the first control signal based on the second clock signal when such signals are received by the second logic circuit. The method may further include the control circuit receiving a third control signal indicating a readiness of the second logic circuit to complete the access operation, wherein the third control signal is asserted by the second logic circuit when the second logic circuit is ready to complete the access operation.

The method may further include the control circuit de-asserting the first control signal and the second control signal from a perspective of the second logic circuit. The control circuit may further be configured to use inherent properties of a protocol associated with the exchange of signals between the first logic circuit and the second logic circuit. The first control signal may comprise a select signal, the second control signal may comprise an enable signal, and the third control signal may comprise a ready signal.

The method may further include one of receiving data signals in response to the access operation or receiving an error signal in response to the access operation. The access operation may comprise a write operation and the relationship may comprise the second control signal trailing the first control signal by any required number of clock cycles of the second control signal.

It is to be understood that the methods, modules, and components depicted herein are merely exemplary. Alternatively, or in addition, the functionality described herein can be performed, at least in part, by one or more hardware logic components. For example, and without limitation, illustrative types of hardware logic components that can be used include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

The functionality associated with some examples described in this disclosure can also include instructions stored in a non-transitory media. The term "non-transitory media" as used herein refers to any media storing data and/or instructions that cause a machine to operate in a specific manner. Exemplary non-transitory media include non-volatile media and/or volatile media. Non-volatile media include, for example, a hard disk, a solid state drive, a magnetic disk or tape, an optical disk or tape, a flash memory, an EPROM, NVRAM, PRAM, or other such media, or networked versions of such media. Volatile media include, for example, dynamic memory such as DRAM, SRAM, a cache, or other such media. Non-transitory media is distinct from, but can be used in conjunction with transmission media. Transmission media is used for transferring data and/or instruction to or from a machine. Exemplary transmission media, include coaxial cables, fiber-optic cables, copper wires, and wireless media, such as radio waves.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:

1. A circuit configured to allow an exchange of signals between a first logic circuit and a second logic circuit, wherein the first logic circuit is clocked using a first clock signal having a first frequency and the second logic circuit is clocked using a second clock signal having a second frequency different from the first frequency, the circuit comprising:
   a first circuit segment configured to receive, from the first logic circuit, a first control signal to select the second logic circuit and a second control signal to indicate an initiation of an access operation, wherein the first circuit segment is further configured to ensure that despite the second frequency being different from the first frequency the second control signal maintains a relationship with the first control signal based on the second clock signal, wherein the circuit includes no components to hold any data signals transferred from the first logic circuit to the second logic circuit; and a second circuit segment configured to receive, from the second logic circuit, a third control signal indicating a readiness of the second logic circuit to complete the access operation, wherein the third control signal is asserted by the second logic circuit when the second logic circuit is ready to complete the access operation.

2. The circuit of claim 1, wherein the second circuit segment is further configured to de-assert the first control signal and the second control signal from a perspective of the second logic circuit.

3. The circuit of claim 2, wherein the first logic circuit is configured to de-assert the first control signal and the second control signal upon receiving the third control signal.

4. The circuit of claim 1, wherein the circuit is configured to use inherent properties of a protocol associated with the exchange of signals between the first logic circuit and the second logic circuit.

5. The circuit of claim 1, wherein the first control signal comprises a select signal, the second control signal comprises an enable signal, and the third control signal comprises a ready signal.

6. The circuit of claim 1 further comprising a fourth circuit segment configured to: receive data signals in response to the access operation or receive an error signal in response to the access operation.

7. The circuit of claim 6, wherein the access operation comprises a write operation and wherein the relationship comprises the second control signal trailing the first control signal by any required number of clock cycles of the second control signal.

8. A system comprising:

a master logic circuit configured to be clocked using a first clock signal having a first frequency;

a slave logic circuit configured to be clocked using a second clock signal having a second clock frequency different from the first clock frequency; and a control circuit configured to allow exchange of control signals and data signals between the master logic circuit and the slave logic circuit, wherein the control circuit comprises:

a first circuit segment configured to receive, from the master logic circuit, a first control signal to select the slave logic circuit and a second control signal to indicate an initiation of an access operation, wherein the first circuit segment is further configured to ensure that the second control signal maintains a relationship with the first control signal based on the second clock signal, wherein the circuit includes no components to hold any data signals transferred from the first logic circuit to the second logic circuit, and wherein the circuit is configured to process the second control signal using a level to pulse converter and a clock domain crossing circuit, and a second circuit segment configured to receive, from the slave logic circuit, a third control signal indicating a readiness of the slave logic circuit to complete the access operation, wherein the third control signal is asserted by the slave logic circuit when the slave logic circuit is ready to complete the access operation initiated by the master logic circuit.

9. The system of claim 8, wherein the second circuit segment is further configured to de-assert the first control signal and the second control signal from a perspective of the slave logic circuit.

10. The system of claim 9, wherein the wherein the master logic circuit is configured to de-assert the first control signal and the second control signal upon receiving the third control signal.

11. The system of claim 8, wherein the control circuit is configured to use inherent properties of a protocol associated with the exchange of signals between the master logic circuit and the slave logic circuit.

12. The system of claim 8, wherein the first control signal comprises a select signal, the second control signal comprises an enable signal, and the third control signal comprises a ready signal.

13. The system of claim 8 further comprising a fourth circuit segment configured to: receive data signals in response to the access operation or receive an error signal in response to the access operation.

14. The system of claim 13, wherein the access operation comprises a write operation and wherein the relationship comprises the second control signal trailing the first control signal by any required number of clock cycles of the second control signal.

15. A method in a system comprising a first logic circuit, a second logic circuit, and a control circuit coupled to both the first logic circuit and the second logic circuit, wherein the first logic circuit is clocked using a first clock signal having a first frequency and the second logic circuit is clocked using a second clock signal having a second frequency different from the first frequency, and wherein the control circuit includes a level to pulse converter and a clock domain crossing circuit, the method comprising:

receiving, from the first logic circuit, a first control signal to select the second logic circuit;

receiving, from the first logic circuit, a second control signal to indicate an initiation of an access operation;

processing the second control signal using the level to pulse converter and the clock domain crossing circuit and providing the processed second control signal to the second logic circuit; and the control circuit receiving a third control signal indicating a readiness of the second logic circuit to complete the access operation, wherein the third control signal is asserted by the second logic circuit when the second logic circuit is ready to complete the access operation.

16. The method of claim 15 further comprising the control circuit de-asserting the first control signal and the second control signal from a perspective of the second logic circuit.

17. The method of claim 16, wherein the control circuit is configured to use inherent properties of a protocol associated with the exchange of signals between the first logic circuit and the second logic circuit.

18. The method of claim 15, wherein the first control signal comprises a select signal, the second control signal comprises an enable signal, and the third control signal comprises a ready signal.

19. The method of claim 15 further comprising one of receiving data signals in response to the access operation or receiving an error signal in response to the access operation.

20. The method of claim 15 further comprising ensuring that the second control signal maintains a relationship with the first control signal based on the second clock signal, wherein the access operation comprises a write operation and wherein the relationship comprises the second control signal trailing the first control signal by any required number of clock cycles of the second control signal.

* * * * *